(12) United States Patent
Li et al.

(10) Patent No.: US 10,863,068 B2
(45) Date of Patent: Dec. 8, 2020

(54) CAMERA MODULE

(71) Applicants: TRIPLE WIN TECHNOLOGY(SHENZHEN) CO. LTD., Shenzhen (CN); HON HAI PRECISION INDUSTRY CO., LTD., New Taipei (TW)

(72) Inventors: Yu-Shuai Li, Shenzhen (CN); Shin-Wen Chen, New Taipei (TW); Kun Li, Shenzhen (CN); Long-Fei Zhang, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 11 days.

(21) Appl. No.: 16/161,676

(22) Filed: Oct. 16, 2018

(65) Prior Publication Data

US 2020/0076997 A1    Mar. 5, 2020

(30) Foreign Application Priority Data

Aug. 29, 2018  (CN) .......................... 2018 1 0998528

(51) Int. Cl.
    *H04N 5/225* (2006.01)
    *G02B 7/02* (2006.01)
    *H05K 1/02* (2006.01)

(52) U.S. Cl.
    CPC ........... *H04N 5/2254* (2013.01); *G02B 7/022* (2013.01); *H04N 5/2257* (2013.01); *H05K 1/0274* (2013.01); *H05K 2201/10121* (2013.01); *H05K 2201/10151* (2013.01)

(58) Field of Classification Search
    CPC .... G02B 7/022; H04N 5/2251; H04N 5/2254; H04N 5/2257; H05K 1/0274; H05K 2201/10121; H05K 2201/10151
    See application file for complete search history.

(56) References Cited

U.S. PATENT DOCUMENTS

| | | | | |
|---|---|---|---|---|
| 9,307,128 | B2* | 4/2016 | Ning | G02B 7/14 |
| 10,110,790 | B2* | 10/2018 | Drotleff | H04N 5/2254 |
| 10,257,398 | B2* | 4/2019 | Park | G03B 13/32 |
| 10,444,463 | B2* | 10/2019 | Yang | G02B 7/021 |
| 2009/0225455 | A1* | 9/2009 | Kawasaki | G02B 9/12 |
| | | | | 359/830 |
| 2010/0103540 | A1* | 4/2010 | An | G02B 7/021 |
| | | | | 359/819 |

(Continued)

FOREIGN PATENT DOCUMENTS

| | | |
|---|---|---|
| CN | 200956062 Y | 10/2007 |
| CN | 102455476 A | 5/2012 |

*Primary Examiner* — Daniel M Pasiewicz
(74) *Attorney, Agent, or Firm* — ScienBiziP, P.C.

(57) ABSTRACT

A camera module to retain a smooth and easy focusing movement through components connected together by threads includes a lens bracket and a lens barrel. The lens bracket carries an optical lens and includes sidewall with a first internal thread. The optical lens includes sensor end. The sensor end includes a lateral surface with an external thread which corresponds to the first internal thread. The lateral surface defines several notches extending from the end of the lateral surface down through the external threads to reduce any clamping or high turning resistance between the internal and the external threads.

16 Claims, 4 Drawing Sheets

(56) References Cited

U.S. PATENT DOCUMENTS

| | | | |
|---|---|---|---|
| 2012/0133825 A1* | 5/2012 | Nakajima | H04N 5/2253 348/374 |
| 2015/0326763 A1* | 11/2015 | Campbell | H04N 5/2253 348/294 |
| 2018/0239105 A1* | 8/2018 | Lee | G02B 7/028 |
| 2019/0025674 A1* | 1/2019 | Hwang | B60R 11/04 |

* cited by examiner

CAMERA MODULE

FIELD

The subject matter herein generally relates to cameras.

BACKGROUND

Camera modules generally include a lens barrel and a lens bracket. The lens barrel and the lens bracket are threaded together. The lens barrel is generally made of metal, and the lens bracket is usually made of plastic. The characteristics of metal machining and characteristics of plastic injection molding are different. The lens barrel and the lens bracket can be excessively twisted when they are held together by threads, which creates difficulty in focusing.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
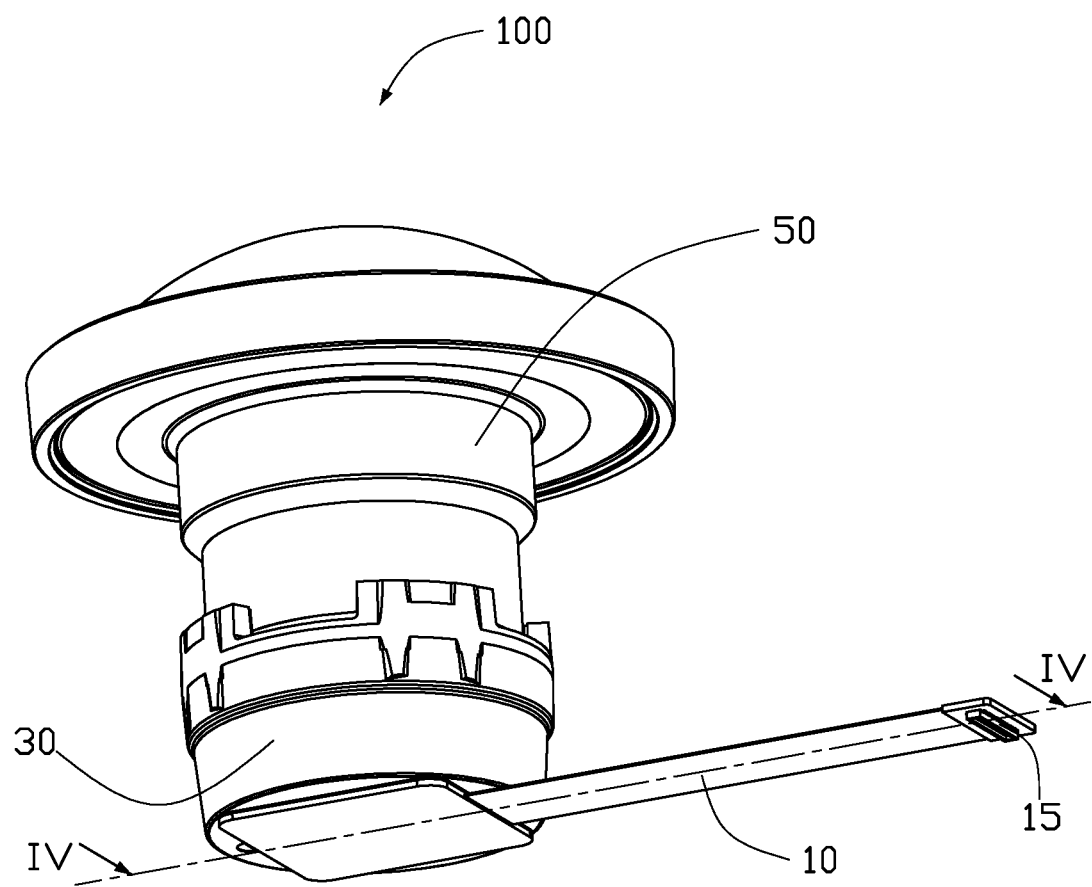
FIG. 1 is an isometric view of a camera module.
Figure 2:
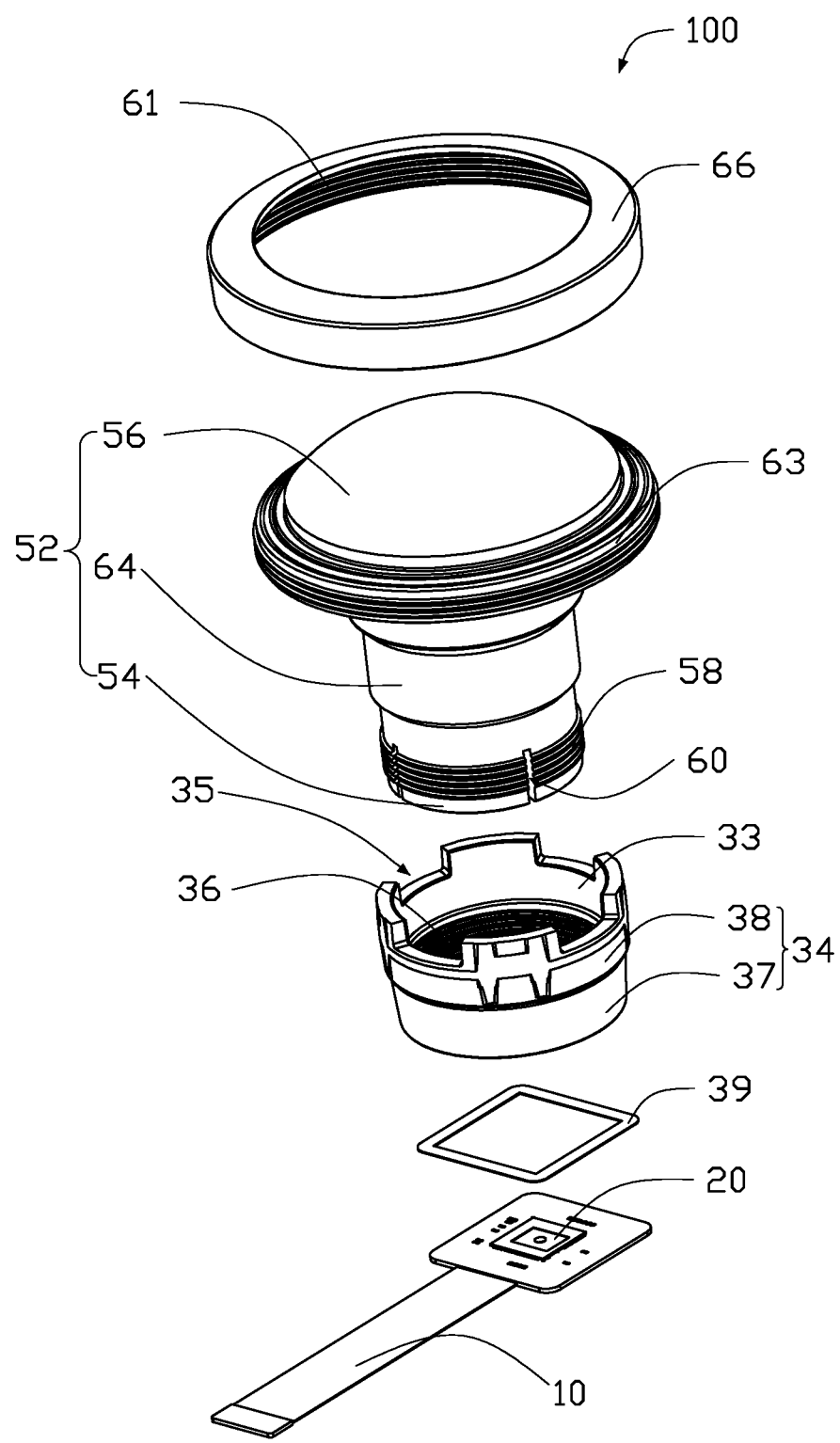
FIG. 2 is an exploded isometric view of the camera module of FIG. 1.
Figure 3:
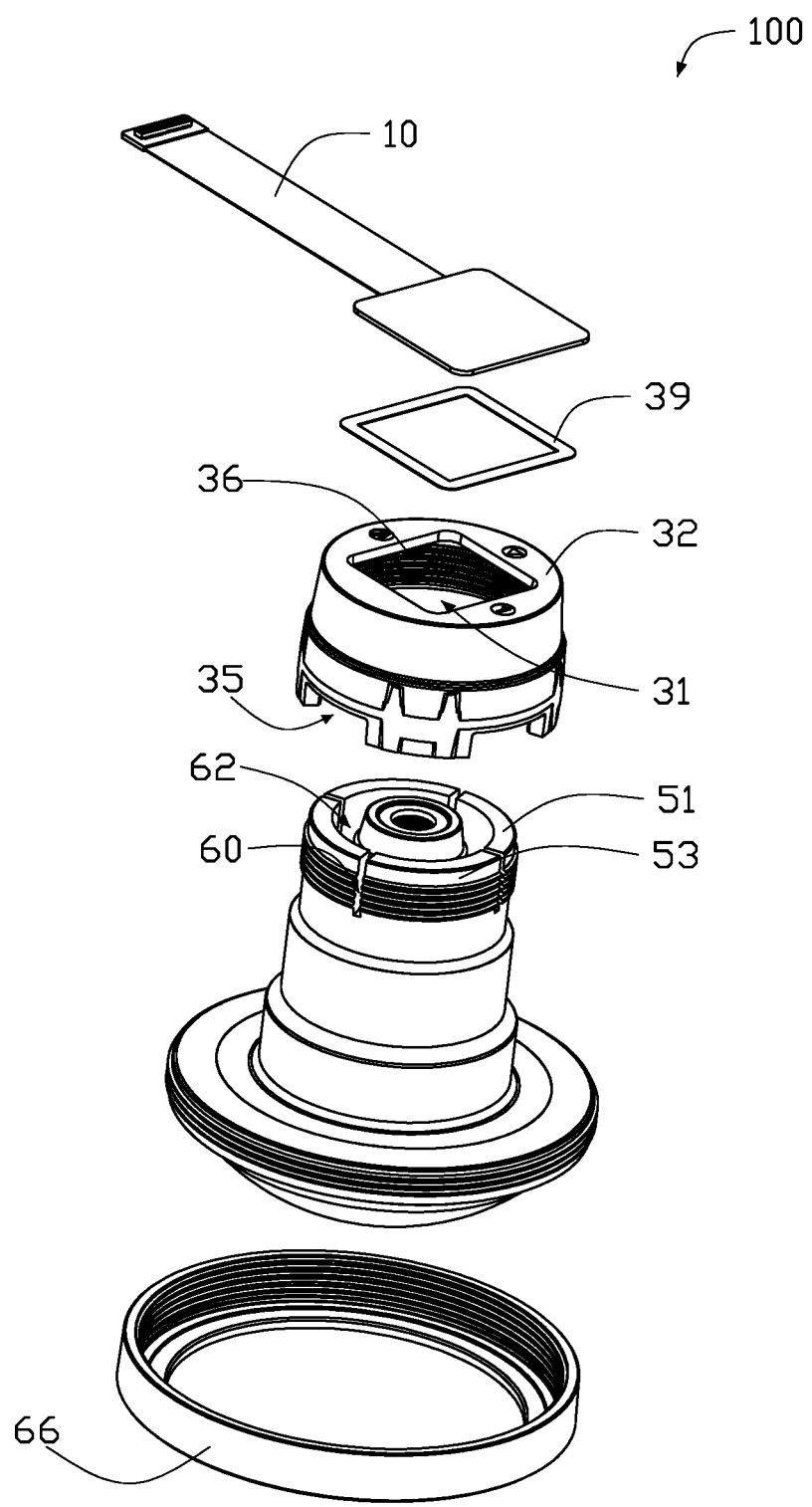
FIG. 3 is similar to FIG. 2, but viewed from a different viewpoint.
Figure 4:
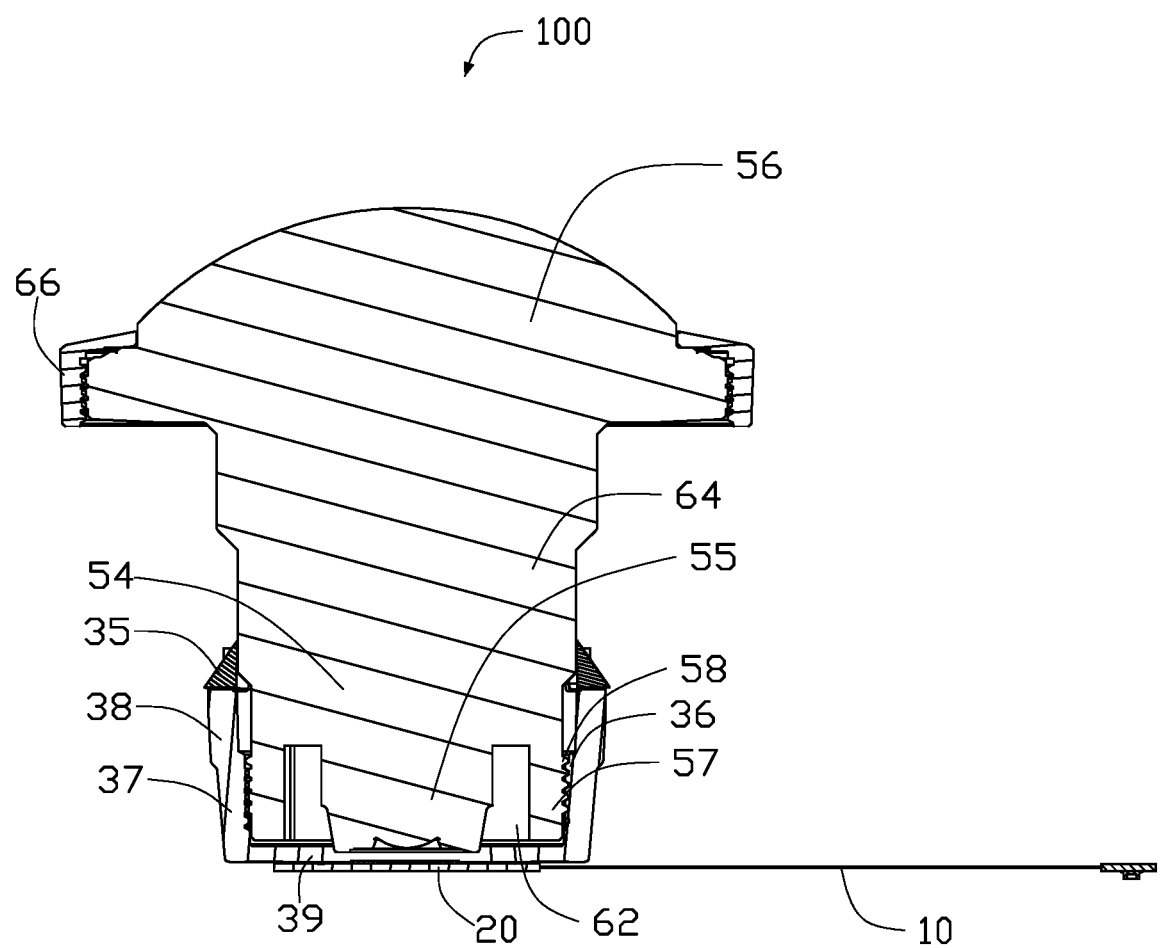
FIG. 4 is a cross-sectional view taken along the line IV-IV of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is showed by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 shows a camera module 100. The camera module 100 includes a printed circuit board 10, an image sensor 20 mounted on the printed circuit board 10, a lens bracket 30 mounted on the printed circuit board 10, and a lens barrel 50 matching with the lens bracket 30.

The printed circuit board 10 can be a flexible circuit board, a rigid board, or a rigid-flexible board. In the embodiment, the printed circuit board 10 is rigid board. The image sensor 20 is electrically connected on one side of the printed circuit board 10. A connector 15 is electrically connected on the printed circuit board 10. The connector 15 is electrically connected to the image sensor 20 and configured to transmit signals between the camera module 100 and external electrical components.

The lens bracket 30 is fixed on the printed circuit board 10. The lens bracket 30 includes a bottom plate 32 and an annular sidewall 34 perpendicularly extending from an edge of the bottom plate 32. The annular sidewall 34 and the bottom plate 32 together defines a receiving cavity 33. The bottom plate 32 defines a through hole 31. The image sensor 20 faces the through hole 31. In this embodiment, the image sensor 20 and the through hole 31 are square-shaped. The receiving cavity 33 communicates with the through hole 31. An inner surface of an end of the annular sidewall 34 adjacent to the bottom plate 32 has a first internal thread 36. An end of the annular sidewall 34 away from the bottom plate 32 defines a number of recessed grooves 35. The recessed grooves 35 are spaced apart circumferentially in the annular sidewall 34.

The annular sidewall 34 includes a first sidewall 37 adjacent to the bottom plate 32 and a second sidewall 38 fixed to an end of the first sidewall 37 away from the bottom plate 32. An inner diameter of the second sidewall 38 is larger than an inner diameter of the first sidewall 37. The first internal thread 36 is disposed on the inner surface of the first sidewall 37. The recessed groove 35 is formed at an end of the second sidewall 38 away from the first sidewall 37.

A sealant 39 is disposed between the bottom plate 32 and the printed circuit board 10. The sealant 39 adheres to the printed circuit board 10 and the bottom plate 32 to fix the printed circuit board 10 to the bottom plate 32.

The lens barrel 50 includes an optical lens 52. The optical lens 52 includes a sensor end 54 adjacent to the bottom plate 32 and an object end 56 away from the bottom plate 32. The sensor end 54 is received in the receiving cavity 33. The sensor end 54 includes an ending surface 51 facing the bottom plate 32 and a lateral surface 53 perpendicular to the ending surface 51. The lateral surface 53 forms a first external thread 58. The first external thread 58 is screwed to the first internal thread 36 to fix the lens barrel 50 to the lens holder 30.

The lateral surface 53 further defines at least one notch 60 extending from the ending surface 51 toward the object end 56. When the lens barrel 50 is rotated relative to the lens bracket 30, for example to focus, even if turning resistance between the first external thread 58 and the first internal thread 36 is large, the notch 60 allows the sensor end 54 to be slightly deformed and eases the turning resistance so that it is easy to focus. In this embodiment, the sensor end 54 carries a number of the notches 60, such as four notches 60. The ending surface 51 is circular. The number of notches 60 are evenly spaced apart along the circumferential direction of the ending surface 51.

The ending surface 51 further defines an annular groove 62. The notches 60 communicate with the annular groove 62. The annular groove 62 separates the sensor end 54 into a lens portion 55 and a mounting portion 57. The notches 60 are defined on the mounting portion 57. The lens portion 55 is aligned with the through hole 31 and faces the image sensor 20.

The optical lens 52 further includes a columnar body 64 secured between the sensor end 54 and the object end 56. An outer diameter of the columnar body 64 is larger than an outer diameter of the sensor end 54. An end of the columnar body 64 adjacent to the sensor end 54 faces the recessed grooves 35 in a radial direction of the columnar body 64. The recessed grooves 35 connect the annular sidewall 34 and an end of the columnar body 64 adjacent to the sensor end 54.

The lens barrel 50 further includes an annular cover 66. A second internal thread 61 is formed on an inner surface of the annular cover 66. The object end 56 is spherical. An edge of the object end 56 forms a second external thread 63. The second internal thread 61 is screwed to the second external thread 63 to fix the annular cover 66 to the object end 56.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A camera module comprising:
   a lens bracket comprising an annular sidewall, an inner surface of the annular sidewall forming a first internal thread; and
   a lens barrel comprising an optical lens comprising a sensor end and an object end, the sensor end comprising an ending surface and a lateral surface perpendicular to the ending surface, the lateral surface forming a first external thread screwed to the first internal thread, the lateral surface defining at least one notch extending from the ending surface toward the object end;
   wherein the ending surface defines an annular groove, the at least one notch communicates with the annular groove, the annular groove divides the sensor end into a lens portion and a mounting portion, the lens portion and the mounting portion are integrally formed, the at least one notch is defined on the mounting portion, the sensor end forms a plurality of the notches, the ending surface is circular, the plurality of the notches is evenly circumferentially spaced apart in the ending surface.

2. The camera module of claim 1, wherein the lens bracket comprises a bottom plate, the annular sidewall perpendicularly extends from an edge of the bottom plate, the annular sidewall and the bottom plate together define a receiving cavity, the sensor end is received in the receiving cavity.

3. The camera module of claim 2, wherein the bottom plate defines a through hole communicating with the receiving cavity, the camera module further comprises a printed circuit board, an image sensor is electrically connected on the printed circuit board, the image sensor faces the through hole, the lens portion is aligned with the through hole.

4. The camera module of claim 3, wherein a sealant is adhered between the bottom plate and the printed circuit board.

5. The camera module of claim 1, wherein the annular sidewall comprises a first sidewall and a second sidewall fixed to an end of the first sidewall, an inner diameter of the second sidewall is larger than an inner diameter of the first sidewall, the first internal thread is disposed on an inner surface of the first sidewall.

6. The camera module of claim 5, wherein the optical lens further comprises a columnar body secured between the sensor end and the object end, an outer diameter of the columnar body is larger than an outer diameter of the sensor end.

7. The camera module of claim 6, wherein an end of the second sidewall away from the first sidewall defines a plurality of recessed grooves, an end of the columnar body adjacent to the sensor end faces the plurality of recessed grooves in a radial direction of the columnar body, the recessed groove is dispensed to connect the annular sidewall and the end of the columnar body adjacent to the sensor end.

8. The camera module of claim 1, wherein the lens barrel comprises an annular cover, a second internal thread is formed on an inner surface of the annular cover, an edge of the object end forms a second external thread, the second internal thread is screwed to the second external thread to fix the annular cover to the object end.

9. A camera module comprising:
   a lens bracket comprising a bottom plate and an annular sidewall perpendicularly extending from an edge of the bottom plate, an inner surface of the annular sidewall forming a first internal thread; and
   a lens barrel comprising an optical lens comprising a sensor end and an object end, the sensor end comprising an ending surface and a lateral surface perpendicular to the ending surface, the lateral surface forming a first external thread screwed to the first internal thread, the lateral surface defining at least one notch extending from the ending surface toward the object end;
   wherein the ending surface defines an annular groove, the at least one notch communicates with the annular groove, the annular groove divides the sensor end into a lens portion and a mounting portion, the lens portion and the mounting portion are integrally formed, the at least one notch is defined on the mounting portion, the sensor end forms a plurality of the notches, the ending surface is circular, the plurality of the notches is evenly circumferentially spaced apart in the ending surface.

10. The camera module of claim 9, wherein the annular sidewall and the bottom plate together define a receiving cavity, the sensor end is received in the receiving cavity.

11. The camera module of claim 10, wherein the bottom plate defines a through hole communicating with the receiving cavity, the camera module further comprises a printed circuit board, an image sensor is electrically connected on the printed circuit board, the image sensor faces the through hole, the lens portion is aligned with the through hole.

12. The camera module of claim 11, wherein a sealant is adhered between the bottom plate and the printed circuit board.

13. The camera module of claim 9, wherein the annular sidewall comprises a first sidewall and a second sidewall fixed to an end of the first sidewall, an inner diameter of the second sidewall is larger than an inner diameter of the first sidewall, the first internal thread is disposed on an inner surface of the first sidewall.

14. The camera module of claim 13, wherein the optical lens further comprises a columnar body secured between the sensor end and the object end, an outer diameter of the columnar body is larger than an outer diameter of the sensor end.

15. The camera module of claim 14, wherein an end of the second sidewall away from the first sidewall defines a plurality of recessed grooves, an end of the columnar body adjacent to the sensor end faces the plurality of recessed grooves in a radial direction of the columnar body, the recessed groove is dispensed to connect the annular sidewall and the end of the columnar body adjacent to the sensor end.

16. The camera module of claim 9, wherein the lens barrel comprises an annular cover, a second internal thread is formed on an inner surface of the annular cover, an edge of the object end forms a second external thread, the second internal thread is screwed to the second external thread to fix the annular cover to the object end.

* * * * *